Oct. 3, 1967 P. M. THOMPSON 3,345,518
MULTI-EMITTER BIPOLAR TRANSISTORS UTILIZED AS BINARY
COUNTER AND LOGIC GATE
Filed June 5, 1964 2 Sheets-Sheet 1

United States Patent Office 3,345,518
Patented Oct. 3, 1967

3,345,518

MULTI-EMITTER BIPOLAR TRANSISTORS UTILIZED AS BINARY COUNTER AND LOGIC GATE

Philip M. Thompson, Ottawa, Ontario, Canada, assignor to Plessey-UK Limited, Ilford, England, a British company Filed June 5, 1964, Ser. No. 373,147
Claims priority, application Great Britain, June 18, 1963, 24,129/63; July 5, 1963, 26,718/63
10 Claims. (Cl. 307—88.5)

This invention is concerned with multi-emitter transistors and circuits incorporating such transistors.

It is among the objects of the invention to provide a circuit arrangement employing a transistor having a plurality of emitters to produce novel effects hitherto only attainable by the use of a further semiconductor device additional to the said transistor.

According to the present invention I provide a circuit arrangement including a transistor having two or more emitter electrodes, at least one of said emitter electrodes being arranged, in use, to operate in the normal forward conduction mode and at least one other of said emitter electrodes being arranged, in use, to operate in a reverse bias base input mode.

The foregoing and further features of the invention will become apparent from the following description of a number of embodiments thereof, with reference to the accompanying drawings, in which.

Figure 1:
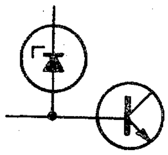
FIGURE 1 is a symbolic circuit diagram illustrating a single emitter transistor with a zener diode connected to its base.
Figure 2:
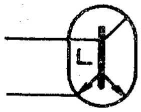
FIGURE 2 is a symbolic diagram of a two emitter transistor with one emitter used as a base input in the reverse bias base input mode.
Figure 3:
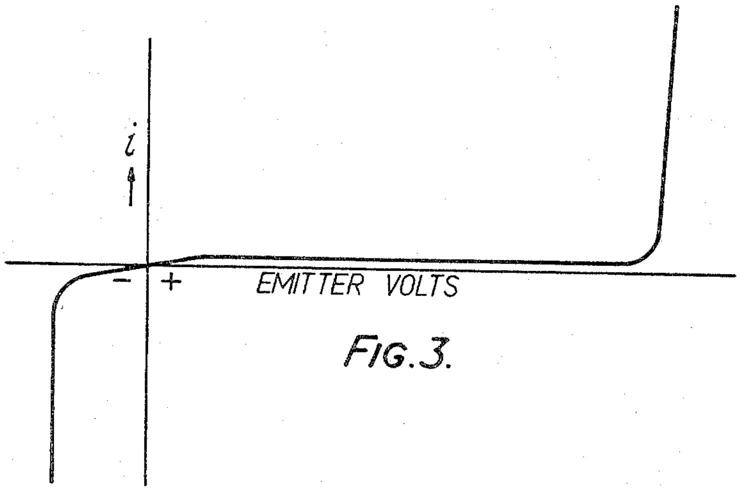
FIGURE 3 is the conduction curve of a single emitter electrode.

FIGURE 1 represents a conventional single emitter transistor having a zener diode connected to the base. The two-emitter transistor illustrated in FIGURE 2 has one emitter connected as base input in the reverse bias base input mode. The connection of a multi-emitter transistor with one of its emitters arranged in the reverse conduction base input mode performs as a conventional transistor with a zener diode connected to the base. The arrangement of FIGURE 1 is thus the electrical equivalent of the device of FIGURE 2. FIGURE 3 shows the conduction curve of a single emitter. If the emitter is biased negative of ground it will conduct in its normal forward mode, while if it is taken positive, it will conduct when its zener or avalanche voltage is reached. At voltages in between these two conduction voltages the emitter may be used as a small capacitor. If the single transistor has several emitters, one may conduct in the forward mode, resulting in normal transistor action, another may conduct in its avalanche mode and behave very much as a "zener" diode connected to the base, while a third may be used as a small base input capacitance. The arrangement of FIGURE 2 reduces the number of circuit components and the associated separate circuit connections, this fact being of considerable importance in the present day application of transistors to a solid state technology.

It also affords a useful way of performing a voltage translation in circuits in which the collector voltages may be relatively high, for example, two volts or greater. Such high logic levels are found to be desirable when it is desired to suppress noise impulses which may be induced in the interconnections between the circuit components. Throughout this specification the emitters which are used in the reverse conduction base input mode, as a base input connection, will be shown on the same side of the transistor as the normal base connection and these emitters will be identified by the breakdown symbol L.

Figure 4:
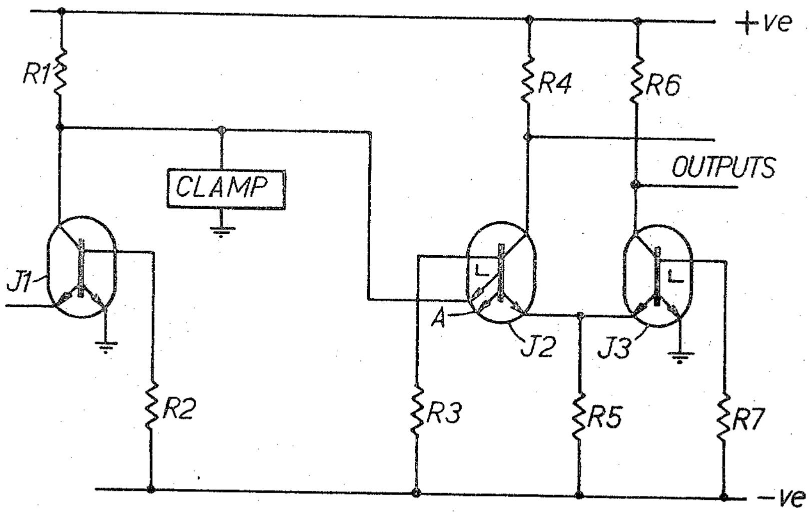
FIGURE 4 is a circuit diagram of a current switching logic circuit.

Referring now to FIGURE 4 the circuit shown therein includes a multi-emitter transistor J1 having one emitter connected in the reverse conduction base input mode to earth, its base connected via a resistance R2 with the negative rail and its collector coupled via a resistance R1 to the positive rail. The collector is also coupled via a suitable clamp arrangement to an emitter of a second multi-emitter transistor J2 this emitter being connected in the reverse conduction base input mode. A second input represented by the point A is applied to a second emitter likewise connected as a base input in the reverse conduction mode. The base of the transistor J2 is connected to the negative rail by a resistance R3 and its collector via a resistance R4 to the positive rail. The remaining emitter of the transistor J2 is used in its normal forward mode and is coupled to an emitter of a third transistor J3, these two emitters being further connected via a resistance R5 to the negative rail. The collector of the transistor J3 is coupled via a resistor R6 to the positive rail and the base of this transistor is connected via a resistance R7 to the negative rail. The transistor J3 has an emitter connected in the reverse breakdown base input mode to earth. The output from the circuit is derived from the collectors of the transistors J2 and J3.

For the maximum switching speed from any type of transistor it will be appreciated that there is an optimum range of collector current and voltage. In the above described circuit this current can be conveniently defined by the resistors R1 to R7 and the mean voltage can be defined by the reverse breakdown potentials of the emitters connected in the reverse breakdown base input mode. In the circuit of FIGURE 3 the collector potentials are clamped near ground potential while the base potentials of the three transistors J1, J2 and J3 are defined by their breakdown voltages. As the emitters of the transistors J2 and J3 are connected to the negative rail via the resistor R5, the current in resistor R5 will be conducted by one transistor or the other depending upon which base of the two transistors is the more positive. If the transistors are fabricated at the same time on the same slice of substrate material the reverse breakdown voltages of the emitters of these two transistors can be very closely matched. Consequently, if the collector of the transistor J1 is positive of ground potential the transistor J2 conducts, while if the collector of J1 is negative of ground potential the transistor J3 conducts. It should be observed that the discrimination level between the transistors J2 and J3 is close to ground potential. When a second input A is provided, the transistor J2 will conduct if either input is made positive of ground potential.

It will be apparent that if in the circuit of FIGURE 4 some of the emitters of the multi-emitter transistors were not used in the reverse conduction base input mode the circuit of FIGURE 4 would require at least four zener diodes thereby involving additional connections and the like.

Figure 5:
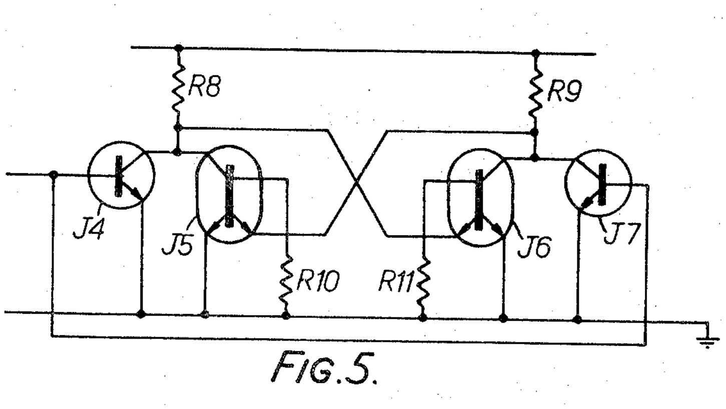
FIGURE 5 is a circuit diagram of a binary counter using cross coupling emitters as capacitors and incorporating multi-emitter transistors.

The circuit shown in FIGURE 5 is based on the appreciation that a large area emitter performs as a satisfactory input capacitance to the base of a transistor. Although the addition of this large area emitter results in an increase of collector area the ratio of the emitter capacitance to the increase in collector capacitance has been found to be not unfavorable because the capacity per unit area of an emitter junction can be approximately five times that of the collector. The circuit of FIGURE 5 utilises this fact and includes four transistors J4, J5, J6 and J7 of which the transistors J5 and J6 are connected so as to form a bistable circuit. Each transistor J5 and J6 has an emitter which is connected in the reverse bias base input mode. The reverse bias base input mode emitter of the transistor J5 is connected to the collector of the transistor J6 and the reverse bias base input mode emitter of the transistor J6 is connected to the collector of the transistor J5. The collectors of the transistors J5 and J6 are connected via resistors R8 and R9 respectively to the positive rail. The bases of the transistors J5 and J6 are respectively coupled via resistors R10 and R11 to earth. The forward conduction mode emitters of both of the transistors J5 and J6 are grounded.

The collector of the transistor J4 is connected to the collector of the transistor J5 and the collector of the transistor J7 is connected to the collector of the transistor J6. The emitters of the transistors J4 and J7 are grounded. The base electrodes of the transistors J4 and J7 are connected to receive input pulses.

The operation of the circuit of FIGURE 5 can be briefly considered as follows. The bistable circuit is triggered by transistors J4 and J7 being switched on and saturated by a short pulse applied to their base electrodes. Initially assuming that the transistor J5 is non-conducting and that the transistor J6 is conducting. The collector of the transistor J5 will be positive so that the resistor J8 will supply current to the base of the transistor J6 via the emitter operating in its reverse bias base input mode. In these circumstances the transistor J6 will be saturated thereby holding its collector electrode at ground potential. The application of an input pulse causes the collectors of both transistors J4 and J7 to be taken to ground potential. Consequently at the collector of transistor J5 there will be no change of voltage but at the input of transistor J6 the voltage will change from the emitter breakdown potential so that the input emitter capacitance will discharge into the base thereof. Some of this charge switches off the transistor J6 and the remainder or excess thereof causes the transistor to assume a potential which is negative of ground. If the pulse applied to the transistors J4 and J7 is removed i.e. if these two transistors switch off before the input emitter capacitance of the transistor J6 has a chance to leak away, the transistor J5 will switch on before the transistor J6 is able to switch on thus hold the transistor J6 in its off condition. The next input pulse applied to the base electrodes of the transistors J4 and J7 will switch the transistor J6 back into conduction and thereby completing the cycling of the bistable circuit.

Figure 6:
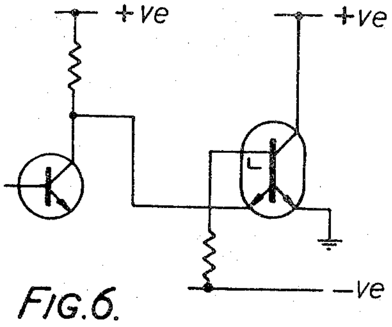
FIGURES 6 and 7 are circuit diagrams schematically illustrating linear circuits having multi-emitter transistors connected in accordance with the present invention.

The above-described multi-emitter transistors in which one or more of the emitters are connected in the reverse bias base input mode can also be utilised in circuits other than logic circuits and a particular application is to linear circuits in which an extra emitter of the transistor is used as a coupling element between a base and the collector of a previous stage. For such purposes the extra emitter can be used in the reverse condition base input mode, as indicated in FIGURE 6. When used in such an arrangement it provides a low impedance at all frequencies. This is a useful feature for application to solid circuit feedback amplifiers.

Figure 7:
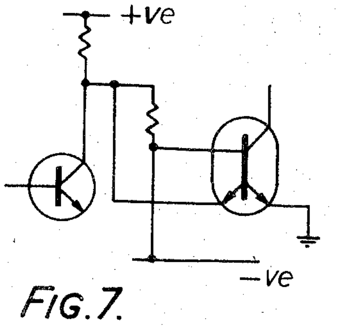

When the reverse bias base input mode emitter is used and is adapted to act as a capacitor it provides a low impedance to high frequencies between the collector of the preceding stage and the base of the next stage. This is shown in FIGURE 7.

Figure 8:
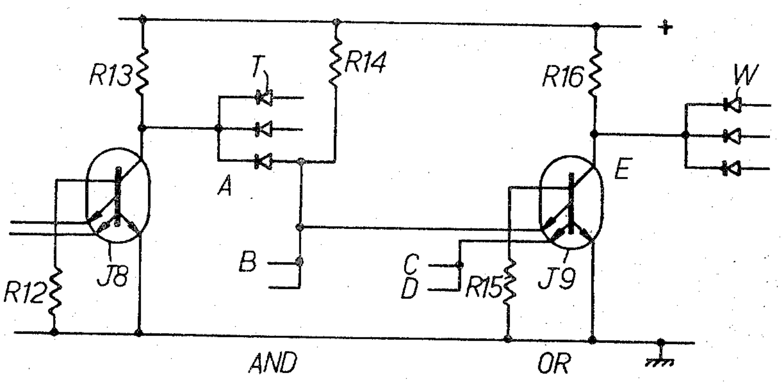
FIGURE 8 is a circuit diagram of a logic gate circuit.

The circuit shown in FIGURE 8 includes a multi-emitter transistor J8 having its base connected to the earth or the ground line via a resistance R12, and one of its emitters connected as a conventional common emitter to the earth line. The collector of the transistor J8 is conected to the positive rail via a p-n diode T and a load resistance R13 and R14 which constitutes part of the next stage. The drawing illustrates an output fan-out, each output including a diode T. The other emitters of the transistor J8 are used in the reverse conduction base input mode and are intended to provide a fan-in input function to the transistor J8. In practice these particular emitters will be connected to the outputs of other stages (not shown) by a suitable p-n diode (not shown). In the same way the collector of the transistor J8 is likewise intended to provide a fan-out output function to the inputs of other stages via the p-n diodes T.

The collector of the transistor J8 is also coupled via the diode T to one of the reverse conduction mode emitters of a second transistor J9. A fan-in input to this emitter can be used, this is illustrated in FIGURE 8. If desired a fan-in input can be used with one or more of the other reverse conduction base input mode emitters. The base of the transistor J9 is coupled by a resistance R15 to the ground line, and the collector thereof is connected to a series of p-n diodes W to provide a fan-out function for the output from the transistor J9. The collector will also be connected to the positive rail via the input of the next stage (not shown).

The diodes, transistors and resistances used in the circuit of FIGURE 8 can be formed as a solid circuit. In particular, the circuit can be relatively simply fabricated inasmuch as the complete circuit can comprise an N-type silicon substrate on to which is diffused the multi-emitter n-p-n transistors and the p-n diodes and the resistors. In practice the base region of the transistors can be extended to produce their base resistors i.e. the resistors R12 in the case of transistor J8 and the resistor R15 in the case of the transistor J9. In other words the transistors J8, the associated base resistance R12 and the diodes T can be provided on single "land" on the substrate; and the transistor J9, its associated base resistance R15 and the diodes W can be on a further land. The remaining resistances, namely the collector load resistances R13, R14 and R16 are provided upon additional lands. That is to say a complete solid state logic circuit can be formed in which the number of isolated "lands" on the substrate is much less than the total number of logic elements and resistances used in the circuit.

On applying inputs to the various reverse conduction mode emitters it is possible readily to form OR gates, AND gates and INVERT gates.

In particular it will be presumed that the reverse conduction base input mode emitters of transistors J9 are used as an OR gate, and that the diodes "T" are used as a part of an AND gate for the following stage with respect to transistor J8—that including the transistor J9.

The operation of the circuit described above can be very briefly expressed as follows:

Assuming the above described connections, then if all of the circuits connected to the reverse conduction mode emitter of transistor J9 are not conducting, the current in the resistor R14 can flow into the base circuit of the transistor J9 and switch it on. If, however a transistor, the transistor J8 coupled to the input of the transistor J9 is conducting, the input terminal is held close to earth potential so that the associated emitter cannot conduct in its reverse conduction base input mode whereupon the transistor J9 is switched off. It has been found that this circuit has a good discrimination against noise and that its switching speed is limited primarily by the total capacitance and current available in the circuit. In particular, if one milliamp is allowed at each input the total delay can be of the order of 0.5 microsecond. The circuit of FIGURE 8 can have voltage levels of +12 volts and 0 volt for the binary numbers "1" and "0" respectively, this giving a discrimination level of +6 volts.

In order to further follow the operation of the circuit of FIGURE 8 there is shown below a so-called "truth table" for the circuit giving the potential at point E for all the combinations of potentials at the points A, B, C and D.

TABLE

| A | B | C | D | E |
|---|---|---|---|---|
| +VE | +VE | +VE | +VE | − |
| +VE | +VE | +VE | −VE | − |
| + | + | − | + | − |
| + | − | + | + | − |
| − | + | + | + | − |
| − | − | + | + | − |
| − | + | − | + | + |
| − | + | + | − | + |
| − | − | − | + | + |
| − | − | + | − | + |
| − | − | − | − | + |
| + | + | − | − | − |
| + | − | − | − | + |
| + | − | − | + | + |
| − | + | − | + | + |
| + | − | + | − | + |

It will be clear that although n-p-n multi-emitter transistors have been illustrated p-n-p multi-emitter transistors could be similarly used.

What I claim is:

1. A circuit arrangement including a bipolar transistor having a collector electrode, a base electrode and at least two emitter electrodes, each capable of transistor co-operation with the collector and base electrodes, means for biasing, with respect to the base electrodes, at least one of said emitter electrodes for operation in a forward conduction mode, and means for reversely biasing, with respect to the base electrode, at least one other of said emitter electrodes to operate in a reverse breakdown conduction mode over at least a part of the operating range of the transistor.

2. A circuit arrangement as claimed in claim 1 wherein at least one of said other emitter electrodes is arranged to operate over at least a part of the operating range of the transistor with a reverse bais sufficient to prevent its operation in the forward-conduction mode and less than the voltage required to produce its operation in the reverse breakdown conduction mde thus causing said at least one emitter electrode to simulate a capacitor connected to the base electrode.

3. A circuit arrangement as claimed in claim 1 wheerin the collector electrode of the said transistor is connected as an input to a two-state circuit so as to produce a current switching logic circuit.

4. A circuit arrangement as claimed in claim 3, including a first supply terminal means of different polarity to that applied to the said other emitter electrode of said transistor, a first resistor connected between the collector electrode of the said bipolar transistor and the first supply terminal means, two plural-emitter transistors, a separate emitter electrode of one of the two plural-emitter transistors being connected to the collector electrode of the said bipolar transistor, a supply terminal means of substantially the same polarity as the said other emitter electrode, and a separate emitter electrode provided in the other of the two plural emitter transistors and connected to the last-mentioned supply-terminal means, each of said separate emitter electrodes being arranged to operate in a reverse breakdown conduction mode, two interconnected emitter electrodes one associated with each of the two plural-emitter transistors, an additional supply terminal means of opposite polarity to the first supply terminal means, a second resistor connected between the additional supply terminal means and the said interconnected emitter electrodes for alternate operation of each of the interconnected emitter electrodes in a forward conduction mode, two further resistors connected between the additional supply terminal means and the base electrode of each of the two plural emitter transistors respectively, and two load resistors each connected between the first supply terminal means and the collector electrode of each of said two plural-emitter transistors respectively, and output terminal means for the circuit, connected to each of said collector electrodes.

5. A circuit arrangement as claimed in claim 4 wherein said one plural-emitter transistor comprise a further separate emitter electrode arranged to operate in the reverse breakdown conduction mode and to constitute a separate input terminal means.

6. A circuit arrangement as claimed in claim 5, comprising a clamp arrangement applied to each of said separate emitter electrodes of said one plural-emitter transistor.

7. A circuit arrangement as claimed in claim 2, including two transistors each having two emitter electrodes, one emitter electrode of each transistor being connected to operate in a forward conduction mode and a second emitter electrode of each transistor being reverse biased to operate over a part of the operating range of its associated transistor in a reverse breakdown conduction mode, and in another part of said operating range with a reverse bias sufficient to prevent its operation in the forward-conduction mode and less than the voltage required to produce its operation in the reverse breakdown conduction mode, and connection means cross-coupling the second emitter electrodes of each transistor to the collector electrode of the other of the two transistors respectively to form a circuit element capable of being used in a binary counter.

8. A circuit arrangement as claimed in claim 7 including two further transistors respectively associated with said two transistors, and means connecting the said second emitter electrode of each of said two transistors to the collector electrode of the associated further transistor respectively.

9. A circuit arrangement as claimed in claim 1 wherein the said bipolar transistor has at least one further emitter electrode reverse-biased similarly to said other emitter electrode thereby to provide a logic gate circuit.

10. A circuit arrangement as claimed in claim 1, which is in solid-state circuit form.

References Cited

UNITED STATES PATENTS

| | | | |
|---|---|---|---|
| 3,204,160 | 8/1965 | Chia-Tang Sah | 307—88.5 |
| 3,233,125 | 2/1966 | Buie | 307—88.5 |
| 3,229,119 | 1/1966 | Bohn et al. | 307—88.5 |
| 3,196,284 | 7/1965 | Hunter | 307—88.5 |

ARTHUR GAUSS, *Primary Examiner.*

J. BUSCH, *Assistant Examiner.*